United States Patent
Sachdev et al.

(10) Patent No.: US 7,608,295 B2
(45) Date of Patent: Oct. 27, 2009

(54) POLYIMIDE COMPOSITIONS AND USE THEREOF IN CERAMIC PRODUCT DEFECT REPAIR

(75) Inventors: Krishna G Sachdev, Hopewell Junction, NY (US); Michael Berger, New Paltz, NY (US); Gregg Monjeau, Wallkill, NY (US); Robert A. Rita, Manlius, NY (US); Kathleen M Wiley, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/684,679

(22) Filed: Mar. 12, 2007

(65) Prior Publication Data

US 2007/0154631 A1    Jul. 5, 2007

Related U.S. Application Data

(62) Division of application No. 10/338,927, filed on Jan. 8, 2003, now abandoned.

(51) Int. Cl.
*B05D 7/00* (2006.01)
*B32B 43/00* (2006.01)

(52) U.S. Cl. ..................................... 427/140
(58) Field of Classification Search .................. 427/140
See application file for complete search history.

(56) References Cited

U.S. PATENT DOCUMENTS

| | | | |
|---|---|---|---|
| 4,552,931 A * | 11/1985 | St. Clair et al. ............. 525/432 |
| 5,115,090 A | 5/1992 | Sachdev et al. | |
| 5,147,966 A * | 9/1992 | St. Clair et al. ............. 528/188 |
| 5,177,180 A * | 1/1993 | Griffin et al. ................ 528/353 |
| 5,219,917 A | 6/1993 | Ingle et al. | |
| 5,304,626 A | 4/1994 | Burgess et al. | |
| 5,310,863 A | 5/1994 | Sachdev | |
| 5,859,171 A | 1/1999 | Sawasaki et al. | |
| 5,869,161 A * | 2/1999 | Choi ......................... 428/41.7 |
| 5,939,498 A * | 8/1999 | Sutton et al. ................ 525/432 |
| 6,133,330 A | 10/2000 | Weiser et al. | |
| 6,262,390 B1 * | 7/2001 | Goland et al. .......... 219/121.85 |
| 6,444,783 B1 | 9/2002 | Dodd et al. | |
| 6,555,238 B2 | 4/2003 | Uhara et al. | |
| 6,605,366 B2 | 8/2003 | Yamaguchi et al. | |
| 2002/0045054 A1 | 4/2002 | Uhara et al. | |

FOREIGN PATENT DOCUMENTS

JP    8-3446    1/1996

\* cited by examiner

*Primary Examiner*—William Phillip Fletcher, III
(74) *Attorney, Agent, or Firm*—DeLio & Peterson, LLC; John J. Tomaszewski; Rosa Suazo Yaghmour

(57) ABSTRACT

A method to repair ceramic substrates is disclosed using a novel polyimide polymer which has high thermal stability, resistance to fluxes and flux residue cleaning solvents and processes, good mechanical properties, good adhesion to all contacting surfaces with low moisture uptake and good flow properties suitable for repairing chipped ceramic, filling deep trench or vias and writing passivation lines with automated process The polyimide polymer is made by reacting aromatic dianhydride and aromatic diamine monomers with a stoichiometric offset and end capping the resulting polymer when the reaction is completed. The preferred polyimide is made using a molar excess of diamine which is end-capped using an anhydride.

8 Claims, No Drawings

POLYIMIDE COMPOSITIONS AND USE THEREOF IN CERAMIC PRODUCT DEFECT REPAIR

BACKGROUND OF THE INVENTION

1. Field of the Invention

This invention is directed to microelectronic devices and, in particular, to a method for repairing defects in high density multilayer ceramic chip carriers using polyimide compositions for the repair process to reclaim product and reduce production cost and to assure product reliability in long term functional performance.

2. Description of Related Art

In the fabrication of high density electronic modules based on multilayer glass ceramic chip carriers, it is generally observed that there is significant loss of product due to ceramic surface damage and internal electrical defects occurring during the manufacturing operations resulting in lower yield which adds to the production cost of the product. Typical surface defects, for example, at the seal band region of non-hermetic and flange areas in hermetic chip carriers caused by handling and test procedures are of the type such as ceramic depressions, voids, cracks or chipped ceramic. For the seal integrity in the top surface protective cap attachment, it is critical that the top surface metal (TSM) flange area be free of such defects in order to assure hermetic sealing to protect the silicon devices from any detrimental effect of environmental exposure during the long-term functional performance of the electronic device. The electrical defects can be internal shorts in metallurgy within layers of multilayer ceramic substrate and surface defects due to manufacturing design errors and plating defects which are sometimes detected at testing after complete fabrication.

A practical and reliable method of defect repair in fully assembled high-density ceramic modules is required to restore/assure long-term functional performance and to recover/reclaim high performance glass ceramic products to provide cost reduction and waste minimization. Without having a workable repair method, many high cost glass ceramic substrates have to be discarded due to internal defects and/or surface defects, adding to the overall product manufacturing cost, waste, and waste disposal cost.

For repair of surface damage and structure defects within layers in assembled modules, passivation with a suitable organic insulator can be used in repair processes for engineering change, exposed metal defects repair and functional repairs to provide protection from solvents, and other materials used in bond and assembly (BAT) processes. For designing and implementing a cost effective repair method, it is necessary that the polymer insulator material(s) have the requisite characteristics for the application, particularly, compatibility with high temperature chip join solder reflow conditions, rosin flux exposure, flux residue solvent cleaning process, good mechanical properties, low moisture absorption, and good adhesion to ceramic and bonding metals to assure functional reliability and its durability in long term use of the device. In addition to high thermal stability required for high temperature device joining by solder reflow requiring 350-365° C. peak temperature for 97/3 lead/tin alloy (97% Pb/3% Sn), the material used for passivation in defect repair is also required to have good adhesion to all contacting surfaces. It is also desirable that the polymer materials used for repair have compatibility with lead-free solder joining of silicon devices to chip carriers up to 260-270° C. peak temperature. Other requirements for the insulator material in defect repair processes is the ability to fill vias up to at least 15 µm deep etched into the ceramic without introducing voids as well as the ability to repair ceramic defects as chipped ceramic by filling with a polymer composition that shows no blistering or voids when it is subjected to thermal curing to form thermally stable polyimide structure. Yet another requirement for the insulator is the ability to write passivation lines with an autodispense tool, for example, a Pen Writer tool, for high throughput repair processes. For automated writing or manual dispense, it is preferred that the material has good wetting of ceramic and metal surfaces, shows no stringiness, be gel-free, maintain line shape and dimension after writing, have good flow properties suitable for automated line writing and via fill without introducing voids and have low shrinkage upon curing.

A number of polyimide compositions for use as passivation coatings and device protection are commercially available. Solder mask compositions are used to cover the selected areas of printed circuit board (PCB) circuitry to prevent solder bridging. None of these materials, however, are found useful for applications requiring defect repair in high-density electronic modules due to incompatibility with the ceramic product repair processes. Automated writing of passivation coating lines with a Pen Writer presents another challenge where continuous writing of line patterns, without the pen tip clogging or wicking, is necessary for high throughput, uniform thickness, and high quality cured films.

U.S. Pat. No. 6,262,390, assigned to the assignee of the subject invention, discloses a method to repair Aluminum Nitride (AlN) substrates using an insulating polyimide derived from reacting stoichiometric amounts of non-rigid dianhydrides and aromatic amines having at least one hexafluoroisopropylidene functionality.

U.S. Pat. No. 5,310,863, assigned to the assignee of the subject invention, discloses novel polyimide materials for use as an interlevel dielectric and passivation layer in the fabrication of thin film structures in ceramic chip carriers for high end applications, the polyimides being derived from rigid or semi-rigid aromatic dianhydrides and linear or non-coplanar aromatic diamines carrying a —CF3 group.

U.S. Pat. No. 5,115,090, assigned to the assignee of the subject invention, is directed to low thermal expansion polyimides derived from rigid-rod and linear-planar dianhydrides and diamines using stoichiometry offset method to generate materials with varying molecular weight.

The high temperature stable polyimides of the prior art derived from linear-rigid-rod and planar precursors generally have low solids content, up to 13-14% (wt. %) in n-methylpyrrolidone (NMP) and thus higher shrinkage upon curing. These polymers invariably require substrate surface preparation for the necessary interface integrity with ceramic, copper and other contacting metals. The cured coatings have glass transition temperature (Tg) above 300° C., typically between 350 and 400° C., have high modulus and tensile strength, which are highly desirable properties for use as interlevel dielectric layer in high density thin film structures.

Selected candidate materials described in the above patents can be used for the purpose of the subject application by using surface modification, deposition of interface metallurgy for adhesion to Cu, typically a thin layer of Cr on Cu prior to polymer application, and multiple coatings for thick coatings. It is, however, preferred that polyimide compositions for the defect repair purposes have higher solids content, up to 25% (wt. %), or more, so as to have lower shrinkage upon curing, have flexibility and flowability and preferably showing thermoplastic behavior at less than 300° C. temperature to allow gap filling and planarization by melt flow of cured coatings, and not necessarily requiring an adhesion promoter for adhesion to ceramic, copper, and other metals.

Bearing in mind the problems and deficiencies of the prior art, it is therefore an object of this invention to provide a method for repairing defects in high density ceramic chip carriers by using improved/modified polyimide compositions for the defect repair processes for product yield loss recovery, production cost reduction, and product reliability assurance in long term functional performance.

Another object is to provide polyimide insulator compositions with special properties for electronic product defect repair having compatibility with automated polymer line patterns deposition with a Pen Writer, having good adhesion to a metal such as Cu, and having compatibility with bond and assembly processes for chip joining using high temperature Pb/Sn solder, lead-free solder joining, flux residue solvent cleaning, and plating solutions for terminal metallurgy.

It is also an object of this invention to provide polyimide materials for passivation or micropassivation for the purpose of repairing under the device buried defects in electronic modules which have solids content in the range about 12 to about 35%, preferably about 15 to about 25% (wt. %) in a high boiling solvent, preferably NMP, and have viscosity and flow properties suitable for pen writing with an automated writing tool and which show low shrinkage and no significant blistering upon curing, and the cured coatings have low moisture uptake.

It is another object of the present invention to provide a method for repairing microelectronic substrates particularly glass ceramic substrates.

It is another object of the present invention to provide a method of repairing ceramic substrates with a material which is compatible with bond and assembly processing which includes high temperature chip join solder reflow conditions, rosin flux exposure, flux residue cleaning solvents and processes, and have good mechanical properties.

A further object of the invention is to provide a method of repairing ceramic substrates with a material, which has good adhesion to all contacting surfaces and has low moisture uptake.

It is yet another object of the present invention to provide a method of repairing ceramic substrates with a material which has good flow properties for filling ceramic via holes and metal trenches without introducing voids and which has low shrinkage upon curing.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of repairing a ceramic substrate surface damage at the non-active region of the substrate such as chipped ceramic, comprising filling the defect area with a polyamic acid composition and curing it to obtain a polyimide insulator repaired surface which is co-planar with the rest of the ceramic region and provides effective encapsulation of the ceramic module.

The invention is directed to, in a second aspect, a method of repairing sub-surface or buried structure defects, for example, under the device chip and surface metal interconnections, in assembled modules for engineering changes, exposed metal defects or functional repairs to provide protection from solvents, and other materials used in bond and assembly processes, comprising filling, for example, by filling etched ceramic via, up to 15 um, or more, by manual dispense or with a Pen Writer at the defect site with a polyimide composition similar to the surface defect repair method to form high temperature stable insulator filled via structure. The invention is further directed to a method of repairing defects in ceramic chip carriers requiring deposition of polymer passivation line patterns in an automated process using a Pen Writer tool for high throughput repair processes, using polyimide compositions of low viscosity, good wetting of ceramic and metal surfaces, where such compositions show no stringiness or drag during deposition, are gel-free, maintain line shape and dimension after writing, and have good flow properties suitable for automated line writing.

The step of filling the repair area with an insulating polymer comprise filling the defect area with a polyimide material derived from flexible or semi-flexible-planar aromatic dianhydride and aromatic diamine precursors (as shown below in the formula 1) wherein a stoichiometric excess of one of the components, preferably the diamine component, is reacted, and when the reaction goes to completion, the residual amine groups are capped with monomeric/monofunctional or difunctional anhydride end-capping agents.

Representative examples of the polyimides preferred according to this invention are shown below in the formula 2.

The step of filling the chipped ceramic defect or etched via with a polyimide may comprise at least one application of the polymer or polymer-filler composition, although multiple applications depending on the solids content and shrinkage upon curing, may also be required comprising the steps of: (a) filling the ceramic defect or via with a first portion of a polymer; (b) partially curing the first portion of the polymer; (c) filling the repair area with another portion of the polymer; (d) partially curing the another portion of the polymer; and (e) repeating the steps (c) and (d) until the repair area is substantially filled and fully cured after the final application to form a polyimide filled repaired area.

The step of filling the defect with an insulating polymer may further include the step of at least partially curing the insulating polymer prior to each application of the polymer. Preferably, to form cured polyimide from polyamic acid or polyamic ester formulation, or polyamic acid-inorganic filler dispersion, the curing steps may comprise the steps of: (a) heating the substrate after first application at about 80° C. to 90° C. for about 30 minutes; (b) followed by heating the substrate at about 140° C. to 150° C. for about 30 minutes; (c) followed by heating the substrate at about 210° C. to 230° C. for about 30 minutes; and (d) a final curing at about 300° C. for about 30 minutes followed by 375° C. to about 400° C. for about 30 to 60 minutes.

The present invention may further include the step of first applying a flexible chain polyamic acid composition as a thin layer less than 2-3 um, over the defect site, partially curing it to 150° to 230° C. and then applying a semi-flexible-planar chain polyimide, subjecting the substrate to stepwise bake/cure cycle up to 370-400° C. to form the passivation layer for defect repair. The sequential deposition of a flexible-chain polymer as thin layer and a semi-flexible-planar chain composition as the bulk coating has the advantage of providing improved adhesion to Cu metallurgy without compromising the superior mechanical properties for the passivation coating. The step of applying a polyamic acid to fill the repair area may comprise applying a polyamic acid composition in n-methyl-pyrrolidone (NMP) derived from flexible or semi-flexible-planar aromatic dianhydride and aromatic diamines monomer precursors as described above. The step of applying a polyamic acid composition to fill the ceramic defect, or vias etched into ceramic or writing line patterns with a Pen Writer contemplates at least one application of the polymer formulation. Preferably, the method further includes the step of at least partially curing the polymer prior to each application of the polymer composition.

In yet another aspect, the present invention is directed to a ceramic substrate repaired in accordance with the previous aspect of the present invention utilizing polyimides shown below in the formula 2.

In still a further aspect, the present invention is directed to a semiconductor device comprising a ceramic substrate having at least one microelectronic device thereon; and a polyimide applied to at least a portion of a surface of the substrate. Representative polyimide structures are shown below in the formula 2. This invention provides novel polyimide compositions and polymer-filler composites and nanocomposites derived therefrom and their applications in ceramic surface defect repair processes and as passivation/micropassivation coatings for repair and recovery of high density multilayer interconnect substrates. It has been discovered that ceramic substrate surface defects such as chipped ceramic at the flange or seal band area can be repaired by filling the defect with a polyimide composition obtained by condensation polymerization of flexible and semi-flexible-planar monomeric precursors using stoichiometry offset in a solvent such as n-methyl-pyrrolidone (NMP). Representative examples of the aromatic dianyhydride and diamine monomers are shown in the formula 1.

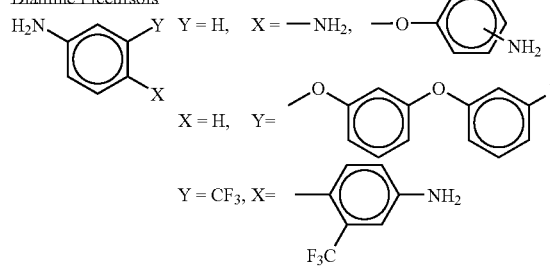

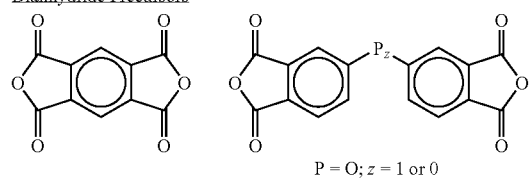

$P = O; z = 1$ or 0

Referring to the formula 1, the following diamine monomers are shown:
p-Phenylene diamine (p-PDA)
4,4' Oxydianiline (4,4' ODA)
3,4' Oxydianiline (3,4' ODA)
1,3-Bis(3-Aminophenoxy)benzene (1,3,3'-APB)
2,2'-Bis(Trifluoromethyl)benzidine (B3FB)
Referring to the formula 1, the following dianhydride monomers are shown:
Pyromellitic Dianhydride (PMDA)
Oxydiphthalic Anhydride (ODPA) (P=O; Z=1)
3,3',4,4'-Biphenyl tetracarboxylic acid dianhydride (BPDA) (Z=O)

Of the above monomers, ODA, APB, and ODPA are considered to be flexible monomers because of the angular constraint imposed by the —O-atom linking the two aromatic rings and the conformational mobility in the molecular structure. Any polyimide made using semi-flexible-planar monomers will be considered herein to be a semi-flexible-planar polymer. A polyimide made using both a flexible diamine and a flexible dianhydride will be considered herein to be a flexible polymer.

The method of repairing a ceramic substrate surface damage such as chipped ceramic involves filling the defect repair area with the polymer composition followed by curing and polishing if necessary to planarize the polymer filled region to obtain a thermally stable polyimide insulator repaired surface co-planar with the rest of the ceramic region. The repaired substrate allows effective encapsulation of the top surface metal (TSM) surface of the ceramic chip carrier for protection of silicon devices from mechanical damage and environmental exposure. Repair of internal and surface electrical defects involves applying the polymer composition as a passivation/micropassivation coating at the repair area to fill via holes and write desired line patterns of the polymer insulator, curing to form thermally stable polyimide coating, and follow-on processing for repair, such as laser ablation, oxygen plasma ashing to remove laser debris, plating of terminal metallurgy and device replacement. Representative examples of the fully cured polyimides derived from the precursors shown in the above formulas are provided in the following formula 2.

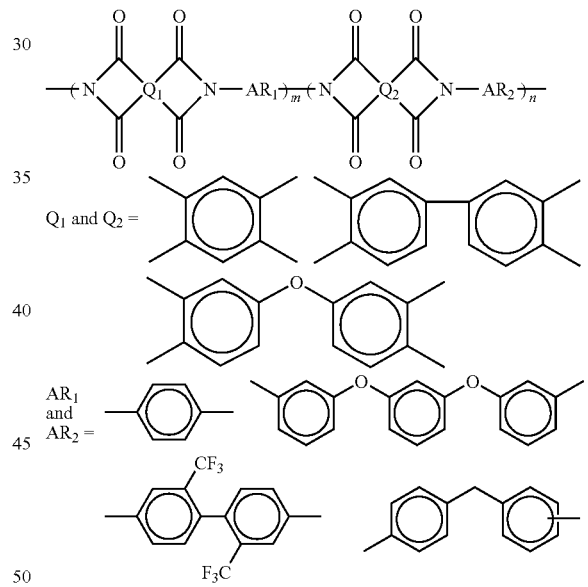

When $AR_1$ and $AR_2$ are the same, the polyimide will have repeating units of the particular diamine monomer. When $AR_1$ and $AR_2$ are different, the polyimide will have both $AR_1$ units and $AR_2$ units on the polymer chain. The same effect is achieved depending on whether $Q_1$ and $Q_2$ are the same or different.

The above polyimide structures show the polymer derived from polyamic acid precursors made using a stoichiometric excess of the diamine component so that amine groups are at each end of the polyamic acid chain. This polyamic acid would be end capped using an anhydride as discussed below. If a stoichiometric excess of the dianhydride was used, anhydride groups would be present at the ends of the polymer chain and would be end capped using an amine.

The total of m and n is typically about 50 to 400.

The method of repairing structure defects within layers in assembled modules for engineering change, and repairing electrical shorts, exposed metal defects, plating defects, or functional repairs to provide protection from solvents, and other materials used in bond and assembly (BAT) processes, comprising filling, for example, by filling etched ceramic vias, which may be up to 15 um deep, by manual dispense or with a Pen Writer at the defect site with a polyimide composition is similar to the surface defect repair method to form high temperature stable insulator filled via structure. The method of repairing defects in ceramic chip carriers using polyimide compositions according to this invention can also be used for via fill when required by the repair process strategy and depositing polymer passivation line patterns using an automated process with a Pen Writer tool for high throughput repair processes. The polymer compositions are of low viscosity, have good wetting to ceramic and metal surfaces, have no stringiness or drag during dispense, are gel-free, maintain line shape and dimension after writing, and have good flow properties suitable for line writing with autodispense tools.

Representative structures of the aromatic dianhydride and diamine precursors preferred for the polyimide compositions according to this invention are given above in the formula 1. The flexible chain polyimides shown in the formula 2, derived from oxydiphthalic anhydride (ODPA) and 3,3'-bis(aminophenoxy)benzene (3,3'-APB), 4,4'-oxydianiline (4,4'-ODA), or 3,4'-ODA or mixtures thereof, are of the type ODPA-APB, ODPA-APB)-(ODPA-ODA) and ODPA-ODA (4,4' or 3,4'-ODA) copolymers. Similarly, for the semi-flexible-planar chain polyimides derived from semi-flexible and/or planar precursors, such as 3,3',4,4'-biphenyl tetracarboxylic acid dianhydride (BPDA), 1,2,4,5-benzenetetracarboxylic dianhydride or pyromellitic dianhydride (PMDA), and planar or semi-flexible-planar diamine, for example, p-phenylene diamine (p-PDA) and 2,2'-bis(trifluoromethyl)benzidine (B3FB), or mixtures thereof.

The polyimide precursor or polyamic acid compositions are obtained by condensation polymerization of the monomers using an offset stoichiometry with an excess either of the diamine monomer or dianhydride monomer, preferably the diamine monomer, and capping of the residual end groups with an anhydride or amine, which upon curing up to 350-400° C. in nitrogen ambient provides a thermally stable polyimide matrix compatible with high temperature chip join operation and flux residue solvent cleaning processes associated with bond and assembly operations, show low moisture uptake, and have good mechanical properties, and good adhesion to all relevant contacting materials.

The polyamic acid compositions according to this invention have controlled molecular weight, solids content up to about 30%, preferably in the range 10% up to 25% (wt. %) in n-methylpyrrolidone (NMP) with 0-10% (vol %) xylene, and a viscosity range suitable for writing line patterns using a Micro pen Writer, for ceramic etched via fill, and for ceramic surface defects such as chipped ceramic repair by manual dispense or with the micro pen writer. Control of molecular weight and viscosity and solids content of the polyamic acid compositions of the invention is obtained by stoichiometry offset of the reactants and end-capping with suitable reactive monomeric reagents selected for interaction with residual unreacted amine or anhydride functionality depending on if the stoichiometry offset contains excess amine or excess anhydride groups at the end of the polymerization reaction. The preferred polyamic acid compositions according to this invention are derived from using a diamine excess for the stoichiometry and end capping with anhydride capping agents.

These polymer compositions can also be modified by the addition of inorganic fillers to form organic-inorganic dispersion or polymer-filler nanocomposite compositions, which upon curing give a relatively hard polyimide matrix having a higher glass transition temperature (Tg), lower thermal expansion (CTE) than the unfilled polyimides, are relatively non-yielding under stress which allows the cured deposits to be polished to form planarized repaired structures without causing gouging. These polyimide composite materials are especially useful for repairing ceramic surface defects which can be depressions/voids, chipped ceramic at the substrate non-active regions, particularly the flange area for hermetic seal or the seal band area for non-hermetic seal with silicone polymer adhesives, for example, Sylgard (trade name of Dow Chemicals).

The flexible and semi-flexible-planar chain polyamides having solids content up to 35% (wt. %), preferably in the range 12 to about 25% (wt. %) and have low viscosity suitable for via fill and deposition of line patterns with autodispense tools. The cured coatings have high thermal stability, and other special properties required for high temperature chip join profile and withstand all the post-chip-join bond and assembly processing exposures (BAT).

In addition to repairing surface defects, the compositions of the invention provide superior performance as passivation coating materials in sub-surface buried electrical defects in the repair and recovery of fully fabricated high circuit density electronic products. Defect repair with the use of polyimide passivation materials of the invention provides yield loss recovery with significant reduction in product manufacturing cost with the added benefit of waste minimization by reclaiming electronic component ceramic products which would be otherwise rejected for not meeting the manufacturing specifications.

The novel polyimide compositions according to this invention having superior performance as passivation coatings in repair processes for ceramic electronic modules and have the following distinctive characteristics:

Unique chemistry using stoichiometry offset and end capping

High solids content with good mechanical properties

Low-shrinkage upon cure

Excellent flow properties suitable for autodispense providing consistent line width Self priming, eliminates need for extra surface priming step Consistent line writing for electronic substrate topside passivation in defect repair Ceramic product defect repair allowing recovery and significant savings Can be applied by hand dispense, squeegee, or autodispense.

High thermal stability, compatibility with BAT processing requirements

Good mechanical & thermomechanical properties

Good adhesion to plated copper without requiring complicated adhesion schemes

Adhesion durability through repair process and reliability stress exposures

Cured coatings are laser ablatable allowing access and repair of buried defect

Compatibility with fillers to form composites/nanocomposites

The polyimide compositions according to this invention have the following special features for compatibility with automated line drawing and via/void/gap fill using pen writer tooling:

No wicking at the pen tip during writing
Smooth and uninterrupted line drawing across the ceramic substrate repair region
No blob-like polymer deposit at the start of line writing
No pen tip clogging during writing or on storage.
Minimum thickness variation across the repair line
Good surface wetting of ceramic and metals The polymer compositions of this invention are synthesized by condensation polymerization of aromatic diamines and aromatic dianhydride monomers preferably in n-methylpyrrolidone- (NMP) solvent using stoichiometry offset to control the molecular weight and viscosity, and end-capping with suitable capping agent at the end of the reaction. Representative examples of the preferred aromatic dianhydrides and diamine precursors for providing the polyimide- and co-polyimides for ceramic surface defect repair and insulator passivation coatings in repair processes for sub-surface buried electrical defects in high density electronic ceramic modules are shown below, while the chemical structures are given in the formulas 1 and 2.

Preferred Aromatic Dianhydride Monomers:
Oxydiphthalic anhydride (ODPA)
3,3',4,4'-Biphenyl tetracarboxylic acid dianhydride (BPDA)
Pyromellitic dianhydride (PMDA)

Preferred Aromatic Diamines:
4,4'-Oxydianiline (4,4'-ODA)
3,4'-Oxydianiline (3,4'-ODA)
p-Phenylenediamine (p-PDA)
2,2'-Bis(trifluoromethyl)benzidine (B3FB)

Polyamic acid compositions derived from these monomers using stoichiometry offset in condensation polymerization in NMP solvent have a preferred viscosity in the range from 2000 to about 30,000 centistokes (cSt) at 25° C. measured by the Cannon Fenske method, and solids content, preferably in the range 12% to 25% (wt./wt. %) in NMP. The offset of monomer stoichiometry is preferably to have a molar excess of the diamine component and preferably in the range of about 97 to 99.5 mole parts of dianhydride for 100 mole parts of diamine resulting in excess amine functional groups when the reaction goes to completion at which time, the residual end groups are capped with monomeric/monofunctional or difunctional anhydride end-capping agents. When a molar excess of dianhydride is used, a range of about 97 to 99.5 mole parts of diamine for 100 mole parts of dianhydride is used resulting in excess anhydride end groups which, when the reaction goes to completion, the residual end groups are capped with monomeric/monofunctional or difunctional amine end-capping agents. The resulting polyamic acid becomes storage stable with no unreacted functional groups that can otherwise cause slow viscosity change, poor shelf life, performance degradation, detrimental effect on cured polyimide properties and other such properties.

Representative examples of the polyimides obtained by curing the polyamic acid compositions derived from the above monomers for applications according to this invention are given below:

Flexible Chain Polyimides:
ODPA/3,3'-APB
ODPA/3,3'-APB/4,4'-ODA
ODPA/3,3'-APB/3,4'-ODA
ODPA/3,3'-APB/3,3'-ODA
BPDA/4,4'-ODA
BPDA/3,4'-ODA
PMDA/4,4'-ODA
PMDA/3,4'-ODA Semi Flexible-Planar Chain Polyimides
BPDA/B3FB
BPDA/pPDA/B3FB
BPDA/pPDA Representative anhydride end-capping agents that can be used with these compositions include: phthalic anhydride, methyl nadic anhydride, phthalic anhydride derivatives with thermally cross linkable functionality as, ,4-methylethynyl phthalic anhydride, 4-ethynyl phthalic anhydride or 4-phenyl ethynyl phthalic anhydride, or an aromatic dianhydride, for example, 4,4'-bis(3,4-dicarboxyphenyl)sulfide dianhydride (BDSDA).

Representative amine capping agents include: 4-ethynylaniline, 4-methoxyaniline, aniline, 4-aminobenzamide, and related aromatic amines.

For color contrast with the glass ceramic substrate, high temperature stable solvent soluble coloring agents can also be added to the composition of the invention without impacting the functional performance and properties. In addition, internal primers such as organosiloxanes, organotitanates, organo zircoalumminates, and combination thereof can be added for adhesion improvement to contacting surfaces. Representative examples of the Oil soluble dyes that were found compatible with the polymer compositions include, Oil Blue N, Sudan Orange G, and related dyes.

Some of the distinctive properties of the polyimide compositions relevant to the application for defect repair processes in high density electronics ceramic chip carriers include: high solid content, up to 25% (wt. %) with the flexible chain polyamic acid solutions and up to 18% with the semi-flexible-planar chain polyamic acids showing low shrinkage upon cure; excellent adhesion to ceramic and copper metallurgy without necessarily requiring surface modification and/or application of an adhesion promoter; good planarization of the polymer coating for further processing as needed; good surface wetting showing no non-wets on the contacting surfaces; cured polyimide coatings having adhesion durability and good interface integrity with contacting surfaces and improved solvent resistance; substantially no blisters or cracks found in the hole filling; and low moisture uptake under temperature/humidity environments. Another unique feature of the fully cured polyimides based on ODPA/3,3'-APB and the copolyimides ODPA/3,3'APB/ODA is that these show thermoplastic behavior, relatively low Tg which ranges from 200° C. to 260° C., and have very high thermal stability, showing less than 0.5% weight loss at 370° C. in dynamic TGA analysis. The high thermal stability of these polyimides is similar to the polyimides that have Tg above 300-350° C. which do not have the thermal flow properties. In terms of compatibility with thermal and solvent exposure, it is observed that ODPA/3,3'-APB polyimide films of thickness >5-7 um tend to undergo crazing when exposed to hot xylene solvent in the flux residue cleaning which is completely healed within 1 min when the substrate is exposed to 220-280° C. temperature, a phenomenon that may be attributed to the thermoplastic flow at this temperature.

The polyimide compositions disclosed also have applications as buffer coatings/shock absorber layer; fiber coatings for polymer matrix compatibility; planarizing/protective coatings on metal, ceramic, and silicon surfaces; polymer-filler composites for high modulus, high strength, and high thermal conductivity coatings in microelectronics, automobile, and aerospace industry.

Various embodiments of the present invention will now be illustrated by reference to the following specific examples. It is to be understood, however, that such examples are presented for purposes of illustration only, and the present invention is in no way to be deemed as limited thereby.

EXAMPLE 1

Flexible Chain Polyimide Composition

A polyamic acid composition, ODPA-3,3'-APB having about 23% solids content with 98.5% stoichiometry offset, was prepared by condensation polymerization of the ODPA and 3,3'-APB in NMP according to the following procedure:

1,3-Bis-(3-Aminophenoxy)benzene) (1,3,3'-APB), 58.4 g (0.2 mole) was dissolved in 405 g of HPLC grade n-methyl-pyrrolidone (NMP) with stirring under nitrogen in a round bottom flask, and 61.06 g (0.197 mole) oxydiphthalic anhydride (ODPA, previously dried at 150° C. for 2 hr under nitrogen) was added in portions with constant stirring within 10-15 min while maintaining the temperature between 30-32° C. After the ODPA addition was complete, stirring was allowed to continue for another 8 hours and then 1.0 g (2 mmole) of 4,4'-bis(3,4-dicarboxyphenyl)diphenyl sulfide dianhydride (BDSDA) was added as a capping agent and the stirring was continued at room temperature for another 6-8 hours when a transparent light amber color viscous solution was typically formed, having viscosity about 2500 cSt measured at 25° C. by the Cannon-Fenske method. The polyamic acid solution was filtered through 1 um cartridge filter and stored in a refrigerator at 5-8° C. with protection from moisture.

This polymer was tested for passivation of Cu features in a process for ceramic chip carrier defect repair. The polymer composition was dispensed onto the ceramic and Cu surfaces at the repair area on the substrate which had been precleaned by oxygen plasma ash and surface modified with an adhesion promoter. After polymer apply, the substrate was subjected to stepwise bake/cure cycle up to 350-370° C. to form fully cured polyimide line pattern.

Alternatively, the substrate surface was precleaned by oxygen plasma ash and surface modified with an adhesion promoter prior to polymer apply.

Microscopic inspection and cross-sections showed excellent adhesion to both ceramic and Cu, via fill with complete side wall coverage, and no evidence of any voids or blisters.

EXAMPLE 2

Flexible Chain Co-Polyimide

A copolymer composition, ODPA/3,3'-APB/4,4'-ODA, using a 50/50 mixture of two diamines, APB-ODA, about 23% solids with 98.5% stoichiometry offset was prepared similar to the polyamic acid of Example 1:

A mixture of bis-(3,3'-Aminophenoxy)benzene (3,3'-APB), 29.2 g (0.10 mole) and 4,4'ODA, 20.0 g (0.1 mole) was dissolved in 370 g of HPLC grade n-methyl-2-pyrrolidone (NMP) with stirring under nitrogen in a round bottom flask, and 61.06 g (0.197 mole) oxydiphthalic anhydride (ODPA, previously dried at 150° C. for 2 hr under nitrogen) was added in portions with constant stirring within 10-15 min while maintaining the temperature between 30-32° C. After the ODPA addition was complete, stirring was allowed to continue for another 8 hours and then 0.7 g of phthalic anhydride was added as a capping agent and the stirring was continued at room temperature for another 6-8 hours when a transparent light amber color viscous solution was typically formed, having viscosity about 2150 cSt measured at 25° C. by the Cannon-Fenske method. The polyamic acid solution was filtered through 1 um cartridge filter for via fill and line writing using autodispense tool. When not in use, the polyamic acid was stored in a refrigerator at 5-8° C. with protection from moisture.

The above polymer composition was tested for TSM (top side metal) passivation in defect repair using the micro pen dispense method to write desired line patterns over Cu and ceramic surfaces, and to fill via holes which may be 10-15 um deep etched into ceramic. Polymer dispense using a small pen tip shows good surface wetting of Cu and ceramic and flows freely into the etched via and during line writing. Curing was carried out by using stepwise bake/cure up to 350-370° C. in N2 purged oven. In both cases, excellent via fill and line writing performance was obtained with no voids or other defects in the cured patterns as shown by the cross-sections. The fully cured polyimide deposits were subjected to all the BAT processing conditions involving high temperature chip join reflow, flux exposure, and solvent cleaning of flux residue. It was found that the generally showed compatibility with the performance requirements for defect repair in processes involving high temperature chip joining.

Although these polyimides show good adhesion to ceramic and metal surfaces as such, it is found beneficial to preclean and modify the surfaces by O2 plasma ashing and application of adhesion promoter, typically 0.1% solution of gamma-aminopropyltriethoxy silane (A1100) in water or aqueous ethanol followed by 80-100° C. bake for 10 min before dispensing polyimide composition.

EXAMPLE 3

Semi-Flexible-Planar Chain Co-Polyimide

A copolymer composition, BPDA/pPDA/B3FB using a 50/50 mixture of the two diamines, pPDA-B3FB, with about 18.6% solids with 99.2% stoichiometry offset using diamine in excess, was prepared as follows:

p-Phenylene diamine (pPDA, recrystallized), 5.4 g (0.05 mole) and 16 g (0.05 mole) 2,2'-bis(trifluoromethyl) benzidine (B3FB, recrystallized), was dissolved in 210 g NMP with 10 ml xylene in a three-neck flask equipped with a mechanical stirrer, a thermometer, and a three-way adapter for nitrogen purge. When the diamine mixture was completely dissolved, 28.96 g (0.0992 mole) of BPDA was added as solid in portions within 10-15 minutes while the reaction mixture temperature was maintained between 26-32° C. After the addition of BPDA was complete, stirring was continued overnight at room temperature, then 0.2 g of phthalic anhydride was added and stirring continued for another 4 to 6 hours when a transparent viscous polyamic acid solution was formed. The solution was filtered through 0.8 um filter cartridge before use for line writing on ceramic and Cu metal using autodispense tool.

This composition was tested as a passivation coating in conjunction with BDSDA capped flexible chain polyimide of Example 1 according to the following method:

In representative defect process, a ceramic substrate with etched via and Cu metal features at the repair region, was precleaned by oxygen plasma ash and surface treated with 0.1% A1100 solution in aqueous alcohol, dried at 80-90° C. for 10 min, cooled to room temperature, and a thin coating of the polymer composition of Example 1 was dispensed into the via hole and/or the Cu features followed by partial bake/cure up to about 230° C. The above polymer compositon (Example 3) was then applied using micropen or squeegee method showing good wetting of the first coat and good flow properties. Curing was carried out using the stepwise bake/cure cycle up to 350-375° C. in nitrogen purged oven. Microscopic inspection and cross sections showed excellent via fill and line writing performance with no voids or other defects in the cured pattern, and the coating was found to be compatible with all the repair process operations including bond and assembly, laser ablation, oxygen ashing to remove the laser debris, plating solutions for terminal metallurgy, and device joining.

EXAMPLE 4

Polyamic Acid/Inorganic Filler Composite

In a representative example of the organic-inorganic composite material for the purpose of this invention, a polyamic acid nanocomposite composition was prepared from the ODPA-3,3'-APB polyamic acid in NMP, of Example 1 by dispersing 0.3 g of an organically modified nanoclay, Cloisite 30B or Cloisite 25A (Southern Clay Products) in 20 g of the polyamic acid NMP described in Example 1 which formed an essentially transparent blend. Curing of the composite material was carried out similar to the polyamic acid compositions using stepwise bake/cure cycle involving 85-90° C. plate bake for 30 min followed by 140-150° C./30 min, the curing in a N2 purged oven at 230° C./30 min, 300° C./30 min, and final cure at 350-375° C. for 60-80 min, the ramp rate being 4-5° C./min. The cured polyimide nanocomposite material was found to be slightly hazy in appearance but it is harder and thus polishable by mechanical means which is highly desirable property for ceramic surface defects repair where the chipped ceramic defect can be 10 to 25 mils in depth and the repaired surface needs to be co-planar with ceramic seal band and flange area for capping assuring the seal integrity in the repaired modules.

An alternate polymer-filler composition was prepared by blending 0.9 g magnesium silicate powder (Talc, Nytal 400) and 0.2 g of the organically modified nonoclay, Cloisite 25A (Southern Clay Products) into 20 g of the ODPA/3.3'-APB/4,4'-ODA polyamic acid composition of Example 2. When the fillers were thoroughly mixed with the polymer matrix, a homogeneous but somewhat opaque blend was formed. This material was used for ceramic defect repair by manual dispense into the chipped site and subjecting to the bake/cure cycle using stepwise process 85-90° C. plate bake for 30 min followed by 140-150° C./30 min, the curing in a N2 purged oven at 230° C./30 min, 300° C./30 min, and final cure at 350-375° C. for 60-80 min, the ramp rate being 4-5° C./min. The cured polyimide composite was found to be harder than the nanocomposite made using the nanoclay alone and has better polishing performance which is a highly desirable property for ceramic defect repair at the flange or seal band region where the repaired surface needs to be co-planar with the rest of the ceramic area to obtain leak-free seal and its integrity in the repaired modules.

Following successful repair, the repair area is filled with an insulating polymer to passivate and seal the repair area from contaminants. The polymer of the present invention is designed to adhere tightly to the walls of the substrate repair area without the aid of adhesion promoters. It is also designed for minimal shrinkage during curing to enhance its adhesiveness and ability to fill the repair area. Its superior flowability in filling the repair area does not require planarization for further processing of the substrate.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of repairing a ceramic substrate comprising the steps of:
   providing a ceramic substrate having a defect;
   coating the defect region with a polyamic acid composition comprising an aromatic diamine monomer and an aromatic dianhydride monomer, where both of the monomers are flexible and a stoichiometric excess of one of the monomers is used, and subsequently endcapping with an amine or anhydride depending on which monomer was used in excess, and wherein the dianhydride monomer is oxydiphthalic anhydride (ODPA) and the aromatic diamine monomer is 1,3-bis(3'-aminophenoxy)benzene (1,3,3'-APB) or the dianhydride monomer is ODPA and the diamine monomer is a mixture of 1,3,3'-APB and one or both of 4,4'-oxydianiline (4,4'-ODA) and 3,4'-oxydianiline (3,4'-ODA); and
   curing the polyamic acid coating to form a flexible polyimide.

2. The method of claim 1 wherein the defect is a surface defect or an internal structure defect.

3. The method of claim 1 wherein the polyamic acid composition is applied in multiple applications with curing or partial curing of the applied polyamic composition before the next application.

4. The method of claim 3 wherein a flexible chain polyamic acid composition is first applied to the defect, partially cured and then followed by a semi-flexible-planar chain polyamic acid composition, after which the polyamic acid is fully cured.

5. The method of claim 1 wherein the polyamic acid composition is in a n-methyl pyrrolidone solvent.

6. The method of claim 1 wherein the polyamic acid composition further contains xylene.

7. The method of claim 1 wherein the polyamic acid composition further contains a coloring agent.

8. The method of claim 1 wherein the polyamic composition further contains an inorganic filler.

* * * * *